United States Patent
Walker

[19]

[11] Patent Number: 6,127,849
[45] Date of Patent: Oct. 3, 2000

[54] SIMULTANEOUS BI-DIRECTIONAL INPUT/OUTPUT (I/O) CIRCUIT

[75] Inventor: Darryl G. Walker, Sunnyvale, Calif.

[73] Assignee: Texas Instruments Incorporated, Dallas, Tex.

[21] Appl. No.: 09/131,987

[22] Filed: Aug. 11, 1998

[51] Int. Cl.$^7$ .............................................. H03K 19/0185
[52] U.S. Cl. ................................ 326/86; 327/27; 327/57; 327/83
[58] Field of Search .................................. 326/86–87, 83, 326/30, 56–58, 27, 121

[56] References Cited

U.S. PATENT DOCUMENTS

| | | | |
|---|---|---|---|
| 5,280,201 | 1/1994 | Fujimori et al. | 326/121 |
| 5,438,281 | 8/1995 | Takahashi et al. | 326/86 |
| 5,528,168 | 6/1996 | Kleveland | 326/86 |
| 5,604,450 | 2/1997 | Borkar et al. | 326/86 |
| 5,739,701 | 4/1998 | Oshima | 326/56 |
| 5,872,471 | 2/1999 | Ishibashi et al. | 326/86 |
| 5,936,429 | 8/1999 | Tomita | 326/86 |

OTHER PUBLICATIONS

Takahashi et al., "CMOS Gate Array with 600 Mb/s Simultaneous Bidirectional I/O Circuits," *IEEE Journal of Solid State Circuits*, Dec. 1995, pp. 1544–1546, vol. 30, No. 12.

*Primary Examiner*—Jon Santamauro
*Attorney, Agent, or Firm*—Bradley T. Sako

[57] ABSTRACT

A simultaneous bi-directional input/output (I/O) circuit (300) is disclosed. The I/O circuit (300) includes an output buffer (302) for driving a data bus line (306) high or low according to a data input signal (Din), and an input buffer (308) for sensing the voltage on the data bus line (306). The input buffer (308) drives a data output node (332) between logic levels by comparing the voltage on the data bus line (306) with a reference voltage (Vref1 or Vref2) that is determined by the data input signal (Din). To eliminate glitches at the data output node (332) caused by the reference voltages switching faster than the data bus line can be driven (306), a transition detector (314) is provided that generates a disable pulse when Din transitions between logic levels. The disable pulse prevents the input buffer (308) from driving the data output node (332) until after the data bus line (306) has been driven in response to the Din signal transition, thus eliminating glitches from being coupled to the data output node (332). Other embodiments delay the speed at which an old reference voltage is switched to a new reference voltage, so that the data bus line (306) has sufficient time to be driven, before the new reference voltage is applied to the input buffer (308), thus preventing the generation of glitches. Circuits for reducing current during both stand-by and active modes of operation are also disclosed.

38 Claims, 8 Drawing Sheets

SIMULTANEOUS BI-DIRECTIONAL INPUT/OUTPUT (I/O) CIRCUIT

TECHNICAL FIELD

The present invention relates generally to semiconductor devices, and more particularly to input/output (I/O) circuits semiconductor devices for receiving and transmitting data.

BACKGROUND OF THE INVENTION

The operating speed and computing power of processor devices continues to increase with each new generation of product. As a result, the ability of such processors to manipulate data can outpace the speed at which data can be provided to the processor by peripheral devices. This limitation on the rate at which data can be transmitted (the data bandwidth), can become the limiting factor in a processor system.

The data bandwidth of a processor system can be increased by expanding the size of a data bus. In the case of personal computer systems, data buses have doubled periodically over time, progressing through 8-, 16-, 32-, 64-, and 128-bit widths. Other applications also use large data buses to address the problem of bandwidth. For example, in the case of parallel computing, multiple parallel processors may employ data buses that are hundreds of bits wide.

The amount by which data buses can be expanded may be limited by the physical requirements necessary to couple integrated circuits to such data buses. Integrated circuits are manufactured in protective packages, and for each bus line, there must be a corresponding package pin to couple the bus line to the integrated circuit within. With possibly hundreds of bus lines, there may not be enough pins available on a package to meet the requirements of the system, or the system may require packages of impractical size.

One approach to increasing data bandwidth without expanding bus size is to use simultaneous bi-directional I/O circuits. In systems having simultaneous bi-directional I/O circuits, data can be transmitted and received on the same data bus line at the same time. This allows the data bandwidth to be essentially doubled without increasing the bus size.

A prior art simultaneous bi-directional I/O circuit is set forth in FIG. 1. The I/O circuit is designated by the general reference character 100, and is shown coupled to a bi-directional data bus line 102. The I/O circuit 100 drives the data bus line 102 between different voltage levels in response to a input data signal (Din) received at data input node 104. The data bus line 102 is coupled to a bond pad 106 that can be connected to a package pin. In addition, the I/O circuit 100 provides an output signal (Dout) at output node 108, in response to variations in the voltage of the data bus line 102.

The I/O circuit 100 is implemented using complementary metal-oxide-semiconductor (CMOS) technology, and includes an output buffer 110 having a driver 112 and a data input inverter I100. The driver 112 is formed from two n-channel metal-oxide-semiconductor (MOS) field effect transistors (FETs), N100 and N101, connected in series between a first high power supply voltage Vcc and a low voltage supply Vss. The Din signal is applied directly from the input node 104 as an input signal to the inverter I100 and as one input to the driver 112. The output of inverter I100 is applied as a second input to the driver 112.

When the Din signal at input node 104 is at a logic high level, transistor N100 is in a conducting state, and a logic high voltage level will applied to the bond pad 106 via data bus line 102. The high Din signal will be inverted by inverter I100, and a logic low will be applied to the gate of transistor N101, and transistor N101 will be in a non-conducting state. When the Din signal at input node 104 is at a logic low level, transistor N100 is in a non-conducting state, and inverter I100 will apply a logic high to the gate of transistor N101, and transistor N101 will be in a conducting state. A logic low will be applied to the bond pad 106 via data bus line 102. In this manner, the data bus line 102 is driven according to the logic values of the Din signal applied at input node 104.

The I/O circuit 100 further includes an input buffer 114 formed by a differential amplifier 116, a multiplexer (MUX) 118, and an output inverter I101. The differential amplifier 116 includes a current source p-channel MOSFET, having a source coupled to a second high power supply voltage Vdd, a gate coupled to Vss, and a drain coupled to a differential pair, formed by p-channel MOSFETs P101 and P102. The sources of the P101 and P102 are commonly coupled to the drain of P100. The gate of P101 is coupled to a reference node 120, which receives one of two reference voltages (Vref1 or Vref2). The gate of P102 is coupled to the data bus line 102. The drains of P101 and P102 are coupled to the drains of two n-channel MOSFETs N102 and N103, which form a current mirror. Transistors N102 and N103 have commonly coupled gates, with the gate of transistor N102 being coupled to its drain. The sources of transistors N102 and N103 are commonly coupled to Vss.

The reference voltage (either Vref1 or Vref2) received by the reference node 120 is determined by the operation of the MUX 118. The MUX 118 receives the Vref1 and Vref2 potential, and couples one or the other to the reference node 120 depending upon the logic level of the Din signal applied at data input node 104 (and as inverted by inverter I100). For example, when Din is a logic high, the reference node 120 is at the Vref2 voltage, and when Din is a logic low, the reference node 120 is at the Vref1 voltage.

The voltage level at which the differential amplifier 116 provides a logic high or logic low output depends upon the potential of the reference node 120. The differential amplifier 116 compares the voltage at the data bus line 102, with the voltage at the reference node 120 (the reference voltage). If the reference voltage (Vref1 or Vref2) is higher than the voltage level of the data bus line 102, the differential amplifier 106 will drive an output line 122 to a logic high level, and data output node 108 will be driven to a logic low level by output inverter I101. Conversely, if the reference voltage (Vref1 or Vref2) is lower than the voltage of the data bus line 102, the differential amplifier 116 will drive the output line 122 to a logic low level, and data output node 108 will be driven to a high logic level by inverter I101. In this manner the input buffer 114 will detect the voltage on the data bus line 102 and drive the output node 108 according to one of two voltage levels (Vref1 or Vref2).

FIG. 2A illustrates a prior art data transmission system 200, that includes first and second bi-directional I/O circuits, shown as 202a and 202b, respectively. The I/O circuits (202a and 202b) are identical to that set forth in FIG. 1, and commonly share a system bus line, DBUS 204. The inherent capacitance of the DBUS line 204 is shown as capacitance C100. The first I/O circuit 202a is shown to include a first output buffer 206a and a first input buffer 208a. The second I/O circuit 202b includes a second output buffer 206b and a second input buffer 208b.

The first I/O circuit 202a drives the DBUS line 204 according to a first data input signal (Din1) at a first data input node 210a, and drives a first output node 212a in response to the DBUS line 204 being driven by the second I/O circuit 202b. In a similar manner, the second I/O circuit 202b drives the DBUS line 204 in response to a second data input signal (Din2) at second data input node 210b, and drives a second output node 212b in response to the DBUS line 204 being driven by the first I/O circuit 202a.

The operation of the data transmission system 200 is best understood with reference to FIG. 2A in conjunction with FIG. 2B. FIG. 2B is a timing diagram setting forth the response of the DBUS line 204, and the data output signals Dout1 and Dout2, according to various transitions in the logic levels of the Din1 and Din2 signals. At time t0, Din1 is at a logic low voltage, and Din2 is at a logic high voltage. The first output buffer 206a in the first I/O circuit 202a, will drive the DBUS line 204 high (Vcc). In contrast, the second output buffer 206b will drive the DBUS line 204 low (Vss). Consequently, the DBUS line 204 will be at a voltage intermediate to Vcc and Vss, shown in FIG. 2B as Vmid.

Referring now to FIG. 2A in conjunction with FIG. 1, it is recalled that if the input signal Din is low, the reference voltage Vref1 will be applied to the differential amplifier 116. The reference voltage Vref1 is selected to be less than Vmid, but greater than Vss. Accordingly, with Vref1 less than the voltage at data bus line 102 (Vmid), the output line 122 will be pulled low, and Dout will be driven to a high logic level. Thus, referring back to FIG. 2A, when Din1 is low and Din2 is high, the DBUS line will be at a voltage level higher than the reference level within first I/O circuit 202a, and the first output signal Dout1 is high. In this manner the first input buffer 208a detects the logic high of the Din2 signal.

In the case of the second I/O circuit 202b, the high Din2 signal will result in the differential amplifier 116 within the second I/O circuit 202b receiving the Vref2 voltage as a reference voltage. Vref2 is selected to be greater than Vmid and less than Vcc. As a result, the second output signal Dout2 will be driven low. Thus, the second input buffer 208b detects the low Din1 signal.

At time t1, Din1 makes a transition from a low logic level to a high logic level. Din2 remains at a logic high level. Referring once again to FIG. 1, when Din makes the low-to-high transition, the MUX 118 will switch from passing Vref1 as the reference voltage, to passing Vref2 as the reference voltage. The gate voltage at transistor P101 will thus transition from Vref1 to Vref2. Simultaneously, the data bus line 102 (which is coupled to the DBUS line 204 in the arrangement of FIG. 2A) will transition from a logic low level to a logic high level. Since the system data bus line DBUS 204 is more capacitively loaded than the reference node 120 within the first I/O circuit 202a, the reference voltage applied to the differential amplifier 116 will switch from Vref1 to Vref2 more quickly than the DBUS line 204 (and consequently the internal data bus line 102) can transition from a logic low level to a logic high level. Accordingly, as set forth in FIG. 2B, while Din1 goes high at time t1, the DBUS line 204 will not go high in response, until time t2.

The delay between the Din1 logic transition and the DBUS line 204 response results in the differential amplifier 118 within I/O circuit 202a reading the DBUS line 204 as a logic low level input signal, even though the logic level of Din2 has not changed. As a result, the Dout1 signal will go low at time t1. When data bus DBUS line 204 reaches the logic high level (above Vref2) at time t2, the differential amplifier 118 within the first I/O circuit 202a will read the correct logic level, and the Dout1 signal will be driven to the logic high level. This dip (glitch) in the Dout1 signal between times t1 and t2 is undesirable.

While the waveforms between times t0 and t2 of FIG. 2A illustrate a low-going glitch that results when one I/O circuit (202b) receives a high input signal (Din2) while the other I/O circuit (202a) receives a low-to-high transition (Din1), a similar adverse effect occurs when one I/O circuit receives a low input signal, while the other input circuit receives a high-to-low transition. This case is illustrated by the waveforms between times t3 and t4.

At time t3, the Din1 signal is low, and the Din2 signal transitions from high to low. The output buffer 206b within the second I/O circuit 202b, begins to drive the DBUS line 204 to a low logic level. At the same, the reference voltage received by MUX 118 within the second I/O circuit 202b changes from Vref2 to Vref1. The same factors giving rise to the low-going glitch in Dout1 result in a high going-glitch in Dout2. The capacitive load presented by DBUS line 204 is greater than that of the reference node 120 within the second I/O circuit 202b, and the DBUS line 204 is not driven low until time t4. Between times t3 and t4, the reference voltage is at Vref1 (Vmid>Vref1>Vss) while the DBUS line 204 is between Vmid and Vref1. As a result, the Dout2 signal will erroneously go high. At time t4, the DBUS line 204 goes lower than Vref1, and Dout2 returns to the proper low logic level.

It would be desirable to provide a simultaneous bi-directional I/O circuit that does not produce the output signal glitches such as those present in the prior art. It also desirable to provide a bi-directional I/O circuit having reduced current consumption.

SUMMARY OF THE INVENTION

According to the preferred embodiment, a simultaneous bi-directional input/output (I/O) circuit includes an output buffer circuit that receives an input data signal at an input node, and transmits this data on a bus line. Concurrently, an input buffer within the I/O circuit monitors the voltage level of the bus line, and drives a data output node in response thereto. The adverse effects of glitches in the data output signal are reduced or eliminated by disabling glitch causing elements within the I/O circuit, or alternatively, preventing glitches from propagating to the data output node.

According to one aspect of the present invention, the input buffer generates signals at an intermediate output node. The signals at the intermediate output node are latched by a latching circuit to provide data output signals. The latching circuit is disabled when glitches are at the intermediate output node, preventing erroneous signals from being latched by the latching circuit.

According to another aspect of the present invention the input buffer circuit that can be disabled to prevent the input buffer from drawing current in a stand-by mode.

According to another aspect of the present invention the output buffer circuit includes a pull-up device for driving the bus line to a high voltage level, and a pull-down device for driving the bus line to a low voltage level. Enabling circuits are provided to prevent both the pull-up and pull-down devices from being turned on at the same time, reducing current consumption by the output buffer circuit.

An advantage of the present invention is that it provides a simultaneous bi-directional I/O circuit having a reduced stand-by current.

Another advantage of the present invention is it provides a simultaneous bi-directional I/O circuit having reduced operating current.

DETAILED DESCRIPTION OF THE EMBODIMENTS

Figure 1:
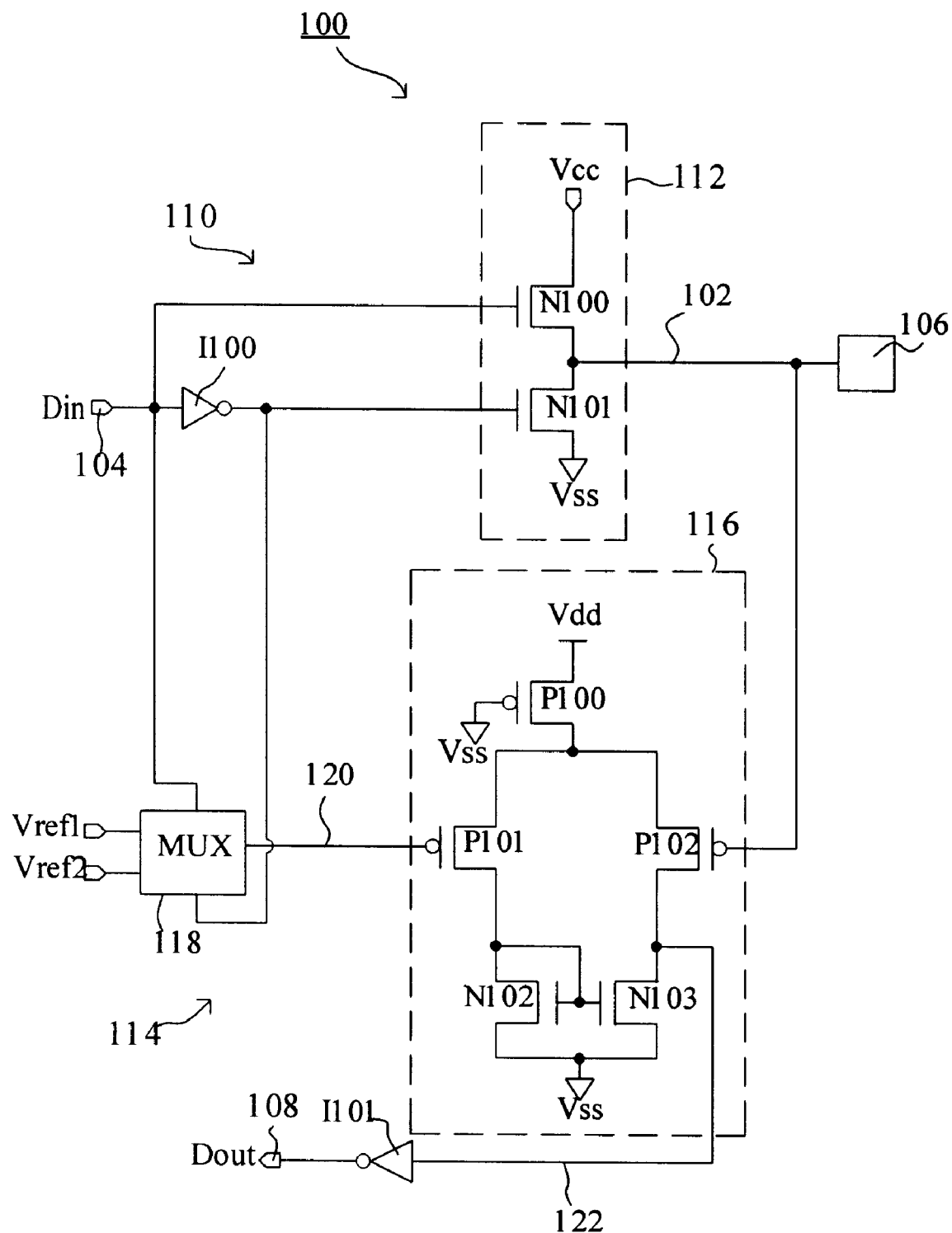
FIG. 1 is a schematic diagram illustrating a prior art simultaneous bi-directional I/O circuit.
Figure 2A:
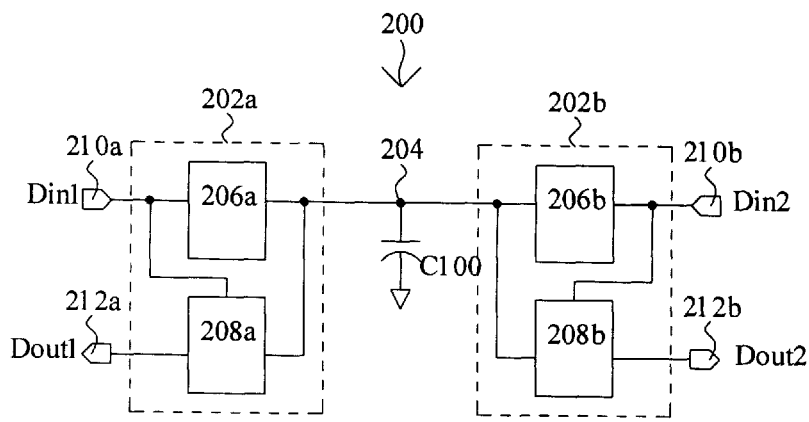
FIG. 2A is a block schematic diagram illustrating a data transmission system implemented with two of the I/O circuits set forth in FIG. 1.
Figure 2B:
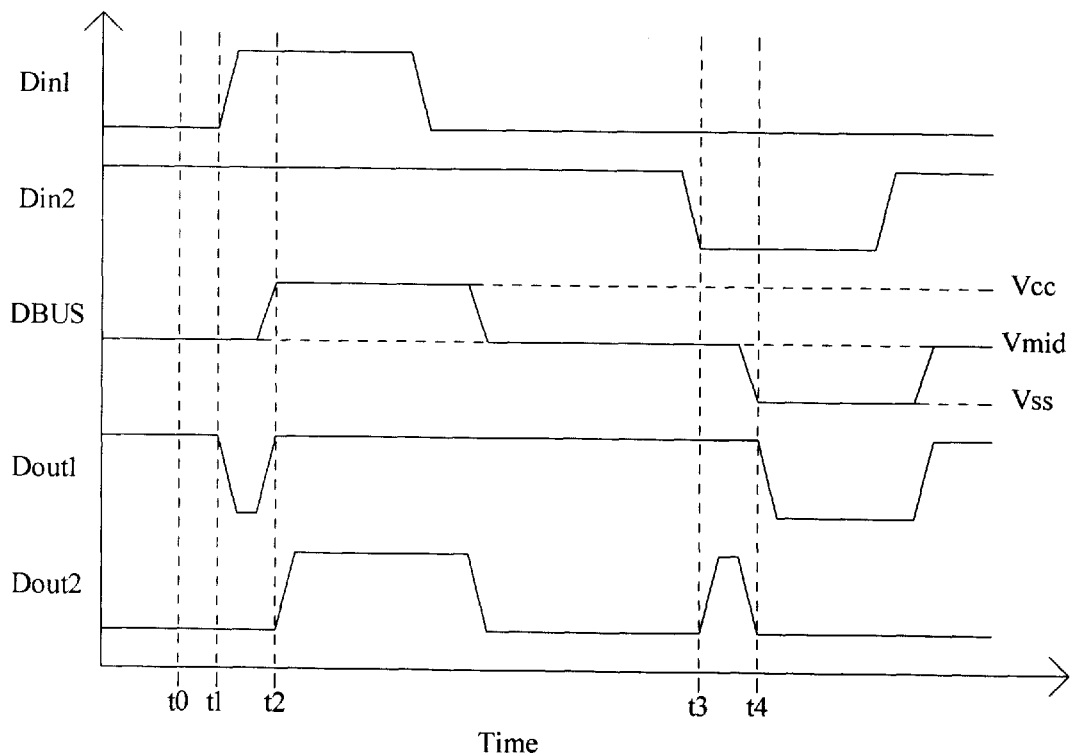
FIG. 2B is a timing diagram illustrating the operation of the system set forth in FIG. 2A.

The present invention will be discussed in connection with system bus driver/receiver embodiments. However, the concepts discussed herein apply as well to a driver circuit used for driving and receiving signals on signal lines contained on an integrated circuit, such as a data line on a semiconductor memory device, as just one example.

FIG. 3 sets forth a schematic diagram of a simultaneous bi-directional I/O circuit, according to a first embodiment. The first embodiment is designated by the general reference character 300, and includes an output buffer 302 coupled between a data input node 304 and a data bus line 306, and an input buffer 308 coupled between the data bus line 306 and an intermediate data output node 310. In addition, a latch 312 receives data from the intermediate output node 310, and a transition detector 314 is coupled between the data input node 304 and the latch 312. The data bus line 306 is coupled to a bond pad 316.

The output buffer 302 receives a data input signal (Din), and in response to the logic state of the Din signal, drives the data bus line 306 to a high or low logic level. The output buffer 302 includes an input inverter I300 and a driver 318 having a pull-up device, N300, and a pull-down device N301. The driver 318 drives the data bus line 306 between a first high supply voltage (Vcc) and a low power supply voltage (Vss). In addition, a pair of cross-coupled two-input NOR gates, G300 and G301, is situated between the driver 318, and data input node 304 and inverter I300. The gates G300 and G301 are "cross-coupled," in that the output of gate G300 is coupled as one input to gate G301, and the output of gate G300 is provided as one input to gate G301. The Din signal is applied directly to the other input of the gate G301, and applied to other input of gate G300 by way of inverter I300. The output of gate G300 drives the pull-up device N300, and the output of gate G301 drive the pull-down device N301.

The introduction of the cross-coupled gates, G300 and G301, prevents the pull-up and pull-down devices (N300 and N301) from being turned on simultaneously, and thus reduces the amount of current consumed by the I/O circuit 300. When the Din signal is low, the output of inverter I300 drives one input of gate G300 high, and the output of G300 is low. The low output of gate G300 turns the pull-up device N300 off, and is cross-coupled back as an input to gate G301. Two low input signals are applied to gate G301 (the direct application of Din and the output of gate G300) and the output of gate G301 is high. The high output of gate G301 turns on the pull-down device N301.

When Din transitions from low to high, the output of gate G301 will go low, turning off pull-down device N301. The low output of gate G301 is applied as an input to gate G300, and the output of gate G300 goes high, turning on the pull-up device N300. In this manner, in a low-to-high transition in the Din signal, the first embodiment turns off the pull-down device N301 before turning on the pull-up device N300, preventing both devices in the driver 318 (N300 and N301) from being turned on simultaneously. This reduces the amount of current drawn by the driver 318 as compared to prior art approaches.

When Din transitions from high to low, the inverter I300 drives one input of gate G300 high, forcing the output of gate G300 low, turning off the pull-up device N300. The low output of gate G300 is also coupled to one input of gate G301. Because Din is low, both inputs to gate G301 are low, and the output of gate G301 is driven high, and the pull-down device is turned on. In this manner, in a high-to-low transition, the first embodiment turns off the pull-up device N300 before turning on the pull-down device N301, preventing both devices in the driver 318 (N300 and N301) from being turned on simultaneously. This also reduces the amount of current drawn by the driver 318 as compared to prior art approaches.

The input buffer 308 monitors the voltage levels on the data bus line 306 to sense transitions caused by other I/O circuits, and in response, drives the intermediate output node 310 between logic high and logic low levels. Unlike prior art input buffers, the input buffer 308 of the first embodiment 300, can be disabled by a read enable signal /REN. In the disabled state the input buffer 308 draws minimal current. The input buffer 308 is shown to include a differential amplifier 320, a multiplexer (MUX) 322, and a read enable gate 324.

The differential amplifier 308 includes a current source p-channel MOSFET P300, having a source coupled to a second high power supply Vdd, a gate coupled to an enable node 326. A read enable signal /REN is applied to the enable node 326. The drain of transistor P300 is coupled to the sources of p-channel MOSFETs P301 and P302, which form a differential pair. The gate of transistor P301 is coupled to a reference node 328, and the gate of transistor P302 is coupled to the data bus line 306. The drains of transistors P301 and P302 are coupled to the drains of n-channel MOSFETs, N302 and N303 which form a current mirror. When the /REN signal is low, current source transistor P300 is turned on, and the differential amplifier 320 sensing function is enabled. When the voltage at the gate of transistor P301 (the reference node 328) is less the voltage at the gate of transistor P302, the differential amplifier 320 will drive an amplifier output 330 low. Conversely, when the voltage at the data bus line 306 is lower than the voltage at the reference node 328, the amplifier output 330 will be high. The differential amplifier 320 is disabled when the /REN signal is high. This is in contrast to prior art simultaneous bi-directional I/O circuits, in which differential amplifiers are maintained in an on state, continuously drawing current.

Referring again to FIG. 3A, the MUX 322 is shown to include two n-channel MOSFETs, N304 and N305. The transistors N304 and N305 have their sources connected to the reference node 328. The drain of transistor N304 is connected to a first reference voltage, Vref1, and the drain of transistor N305 is connected to a second reference voltage Vref2. The operation of the MUX 322 is controlled by the Din signal, with the gate of N304 being coupled to the output of inverter I300, and the gate of N305 being coupled to the data input node 304. When the signal Din is high, transistor N304 is off, transistor N305 is on, and the reference voltage Vref2 is coupled to the reference node 328. When the Din signal is low, transistor N305 is off, and transistor N304 is on, and the reference voltage Vref1 is coupled to the reference node 328.

The read enable gate 324 of the first embodiment prevents the output of the differential amplifier 320 from reaching the intermediate output node 310. The read enable gate 324 is shown to include a gating inverter I301 and n-channel MOSFET N306. When /REN is low, transistor N306 is on, and the voltage at the amplifier output 330 is coupled to the intermediate output node 310. When /REN is high, transistor N306 is off, and the amplifier output 330 is isolated from the intermediate output node 310.

The latch 312 of the first embodiment I/O circuit 300 includes two cross-coupled inverters, I302 and I303. The latch 312 is coupled to the intermediate output node 310 by pass transistor N307. The output of the latch 312 is a data output node 332. Within latch 312, the output of inverter I303 is coupled back to the input of inverter I302, and inverter I303 has a lower drive strength than inverter I302. The gate of transistor N307 is driven by transition detector 314. When transistor N307 is turned on, the data at intermediate output node 310 will be latched within latch 312. When transistor N307 is turned off, the latch 312 is isolated from intermediate output node 310, and the voltage at intermediate output node 310 will have no effect on the data output node 332 signal.

The transition detector 314 enables, or alternatively disables, the pass transistor N307. The transition detector 314 includes a two-input exclusive NOR gate G302, and a delay circuit 334. The Din signal is coupled directly to one input of gate G302, and coupled to the other input through a delay circuit 334. When Din is in a steady state, at either a high or low logic level, the same voltage will be applied to both inputs of gate G302 and the output of gate G302 will be high, enabling the pass transistor N307. When Din transitions from low-to-high or high-to-low, due the delay circuit 334, the inputs of gate G302 will have opposite logic conditions, and the output of G302 will go low for a time period determined by the delay circuit 334. With the output of gate G302 low, the pass transistor N307 will be disabled. In this manner, when Din makes a logic transition that may generate glitches at intermediate output node 310, the pass transistor N307 will be disabled, preventing the latch 312 from storing erroneous data caused by the glitches.

Figure 3A:
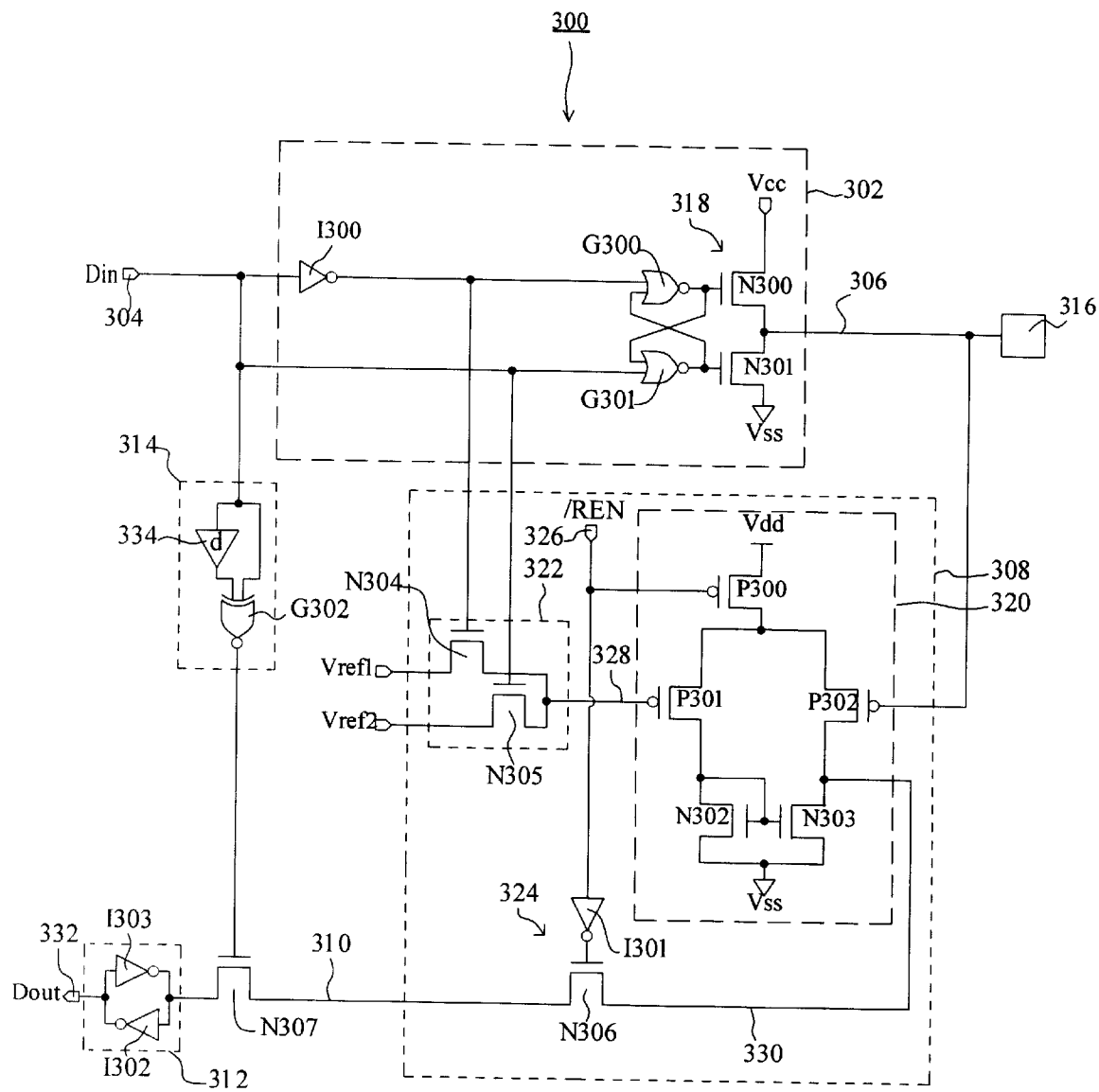
FIG. 3A is a schematic diagram illustrating a simultaneous bi-directional I/O circuit according to a first embodiment.
Figure 3B:
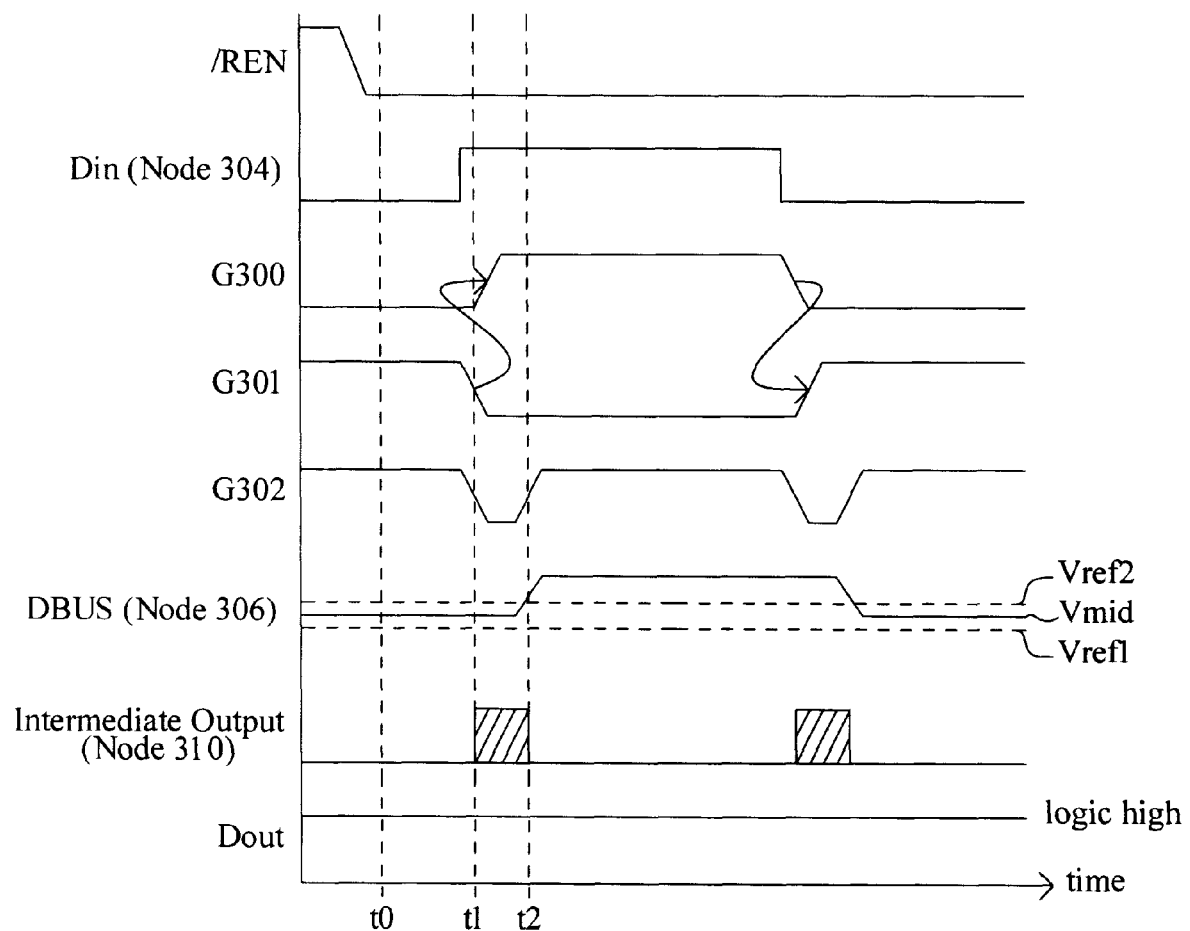
FIG. 3B is a timing diagram illustrating the operation of the first embodiment set forth in FIG. 3A.

FIG. 3B is a timing diagram illustrating the operation of the I/O circuit 300 set forth in FIG. 3A. FIG. 3B sets forth waveforms representing the outputs of gates G300–G302, the data bus line 306, the intermediate output node 310, and the data output node 332 (Dout) in response to a Din signal that transitions from a low logic level, to a high logic level, and then returns back to the low logic level.

Referring now to FIG. 3A in conjunction with FIG. 3B, at time t0, the Din input is low. As described above, with Din low, the outputs of gates G300 and G301 will be low and high, respectively, and transistor N301 will be on and transistor N300 will be off. The low Din signal will also be applied to the transition detector 314, and both inputs of gate G302 will be low, and the output of gate G302 will high, enabling pass transistor N307. Within the input buffer 308, the low Din signal results in the Vref1 reference voltage being coupled to the reference node 328. The signal /REN is low, and so the differential amplifier 320 is enabled.

For the purposes of this description it is assumed that the data bus line 306 is being driven high by another I/O circuit (not shown). Between the other I/O circuit driving the data bus line 306 high and transistor N301 driving the bus line 306 low, the bus line 306 potential ends up at an intermediate voltage, Vmid. The reference voltage Vref1 is selected to be less than Vmid, and so the differential amplifier 320 drives amplifier output 330 low. The signal /REN is low, enabling the read enable gate 324, coupling the low amplifier output 330 to pass transistor N307. The output of the transition detector 314 is high, allowing the low amplifier output 330 to be coupled to the latch 312, and the Dout signal is latched high.

The Din signal undergoes a low-to-high transition just before time t1. The cross-coupled NOR gates G300 and G301 operate as previously described, turning off transistor N301, and then turning on transistor N300. At the same time, the Din logic transition generates a low going pulse at the output of transition detector 314. With Din high, the reference voltage Vref2 will be coupled to the reference node 328. The voltage Vref2 is selected to be greater than Vmid. With N300 on, the voltage at the data bus line 306 will begin to rise. However, due to the capacitive load on the data bus line 306, the reference voltage may switch to Vref2 before the data bus line 306 can rise above Vref2, creating a glitch at the amplifier output 330. However, unlike prior art I/O circuits, the pulse generated by the transition detector 314 turns off transistor N307 between time t1 and t2, preventing any glitches on the intermediate output node 310 from being latched by latch 312, and causing an erroneous Dout signal. Thus, as set forth in FIG. 3B, the voltage level of the intermediate output node 310 between times t1 and t2 does not matter, as the intermediate output node 310 is isolated from the latch 312.

At time t2, the transition detector 314 pulse terminates, and the output of gate G302 returns to a high logic state, turning on transistor N307. By time t2, the data bus line 306 has risen above Vref2, eliminating the conditions that can give rise to a glitch.

Figure 4A:
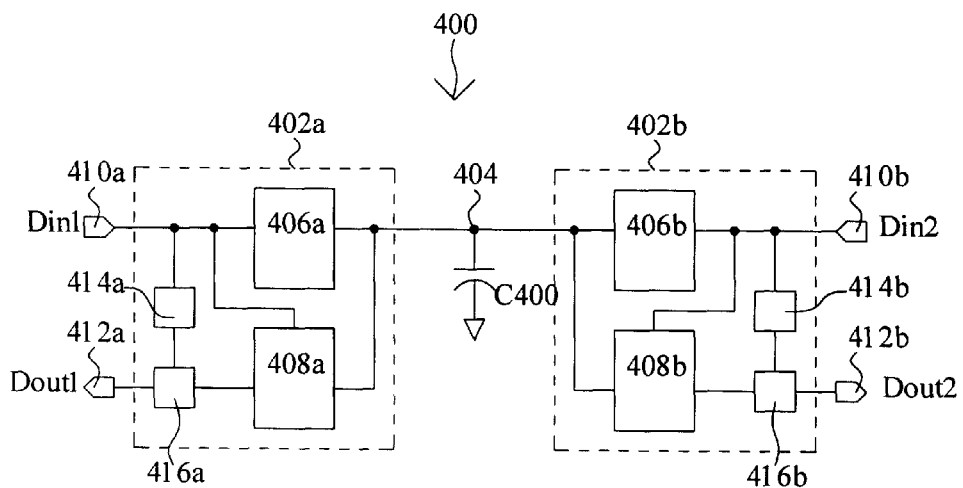
FIG. 4A is a block schematic diagram illustrating a data transmission system according to a preferred embodiment.

Referring now to FIG. 4A, a data transmitting system according to a first embodiment is set forth in a block schematic diagram. The system is designated by the general reference character 400, and includes a first bi-directional I/O circuit 402a coupled to a second bi-directional I/O circuit 402b across a system data bus line, DBUS 404. The first and second I/O circuits 402a and 402b can be identical to the I/O circuit set forth in FIG. 3A. The first I/O circuit 402a includes a first output buffer 406a coupled between a first data input node 410a and the DBUS line 404, and a first input buffer 408a coupled between the DBUS line 404 and first data output node 412a. In a similar arrangement to the first I/O circuit 402a, the second I/O circuit 402b includes a second output buffer 406b, second input buffer 408b, a second data input node 410b and a second data output node 412b. In addition, the first I/O circuit 402a includes a first transition detector 414a and a first latch 416a, and the second I/O circuit 402b has a corresponding second transistor detector 414b and a second latch 416b.

Figure 4B:
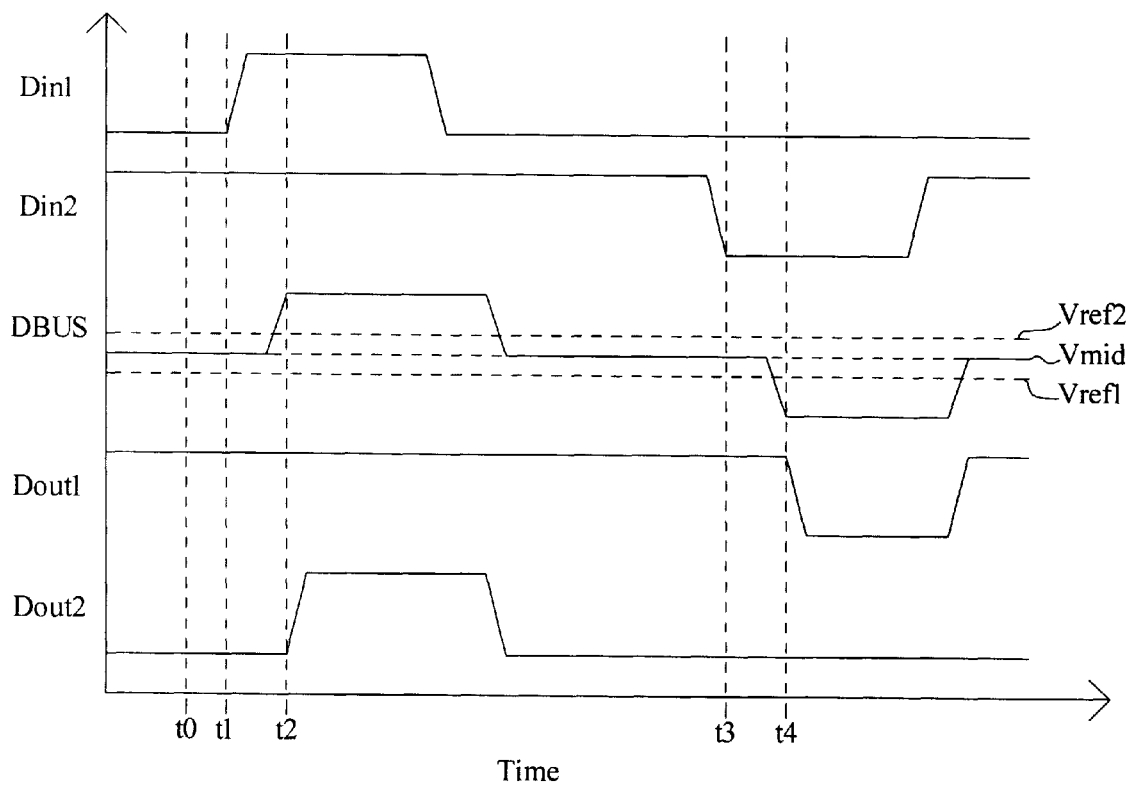
FIG. 4B is a timing diagram illustrating the operation of the system set forth in FIG. 4A.

The operation of data transmission system 400 of FIG. 4A is best understood with reference to FIG. 4B. At time t0, the DBUS line 404 is being driven high by the first I/O circuit 402a and being drive low by the second I/O circuit 402b, and so is at an intermediate level, Vmid. The low Din1 signal results in the first input buffer 408a having a reference voltage of Vref1. The high Din2 signal results in the second input buffer 408b having a reference voltage of Vref2. With a reference voltage of Vref1 and the DBUS line 404 at Vmid (Vmid>Vref1), the first input driver 408a produces a low output. In the absence of a transition in the Din1 signal, the first transition detector 414a enables the first latch 416a, and the low output from the first input buffer 408a is inverted and latched within first latch 412a, producing a high Dout1 output. The high Din signal results in the second input buffer 408b having a reference voltage Vref2. With the DBUS line 404 at Vmid, and a reference voltage of Vref2 (Vref2>Vmid), the second input buffer 408b produces a high output. The second latch 416b is enabled, as there is no transition in Din2, and the high output from the second input buffer 408b is latched and inverted in the second latch 416b. The signal Dout2 is thus low.

At time t1, the signal Din1 transitions high while Din2 remains high. The first output buffer will begin to drive the DBUS line 404 high. At the same time, the reference voltage at the first input buffer 406a will switch from Vref1 to Vref2, possibly resulting in glitches. The Din1 transition is detected by the first transition detector 414a which temporarily disables the first latch 416a, and any glitches generated within the first input buffer 408a are prevented from being latched in the first latch 416a. In this manner, the Dout1 signal remains high between times t1 and t2 (the pulse width of the first transition detector 414b), accurately reflecting the Din2 input signal level.

At time t2, the DBUS lines 404 is driven to a high logic level, higher than Vref2. At this time the first transition pulse detector 414a enables the first latch 416a. With the reference voltage in the first input buffer 408a at Vref2, and the DBUS line 404 greater than Vref2, the input buffer generates a low output. This low output is once again applied to the first latch 416a, and Dout2 remains high. Within the second I/O circuit 402b, with Din2 at a logic high level, the reference voltage within the second input buffer 408b remains at Vref2. With a reference voltage of Vref2 and the DBUS line 404 now at a voltage greater than Vref2, the output of second input buffer 408b changes from a high to a low level. This low level is latched and inverted in the second latch 416b, producing a high Dout2 level, reflecting the change in the Din1 signal.

At time t3, Din2 transitions from a logic high to a logic low level, while Din1 remains low. The reference voltage within the second input buffer 408b changes from Vref2 to Vref1, possibly generating glitches in the Dout2 signal, as the DBUS line 404 may still be above the Vref1 voltage level. Due to the operation of the second transition detector 414b, the high-to-low transition in the Din2 signal temporarily disables the second latch 416b between times t3 and t4, preventing any glitches in the output of the second input buffer 408b from being latched. Dout2 thus maintains a logic low output, correctly reflecting the state of the Din1 signal.

At time t4, the DBUS line 404 is below the Vref1 voltage, and the second input buffer 408b provides a high output once again. The second transition detector 414b no longer disables the second latch 416b, and a high output from the second input buffer 408b is applied once more to the second latch 416b resulting in a low Dout2 signal.

Figure 5:
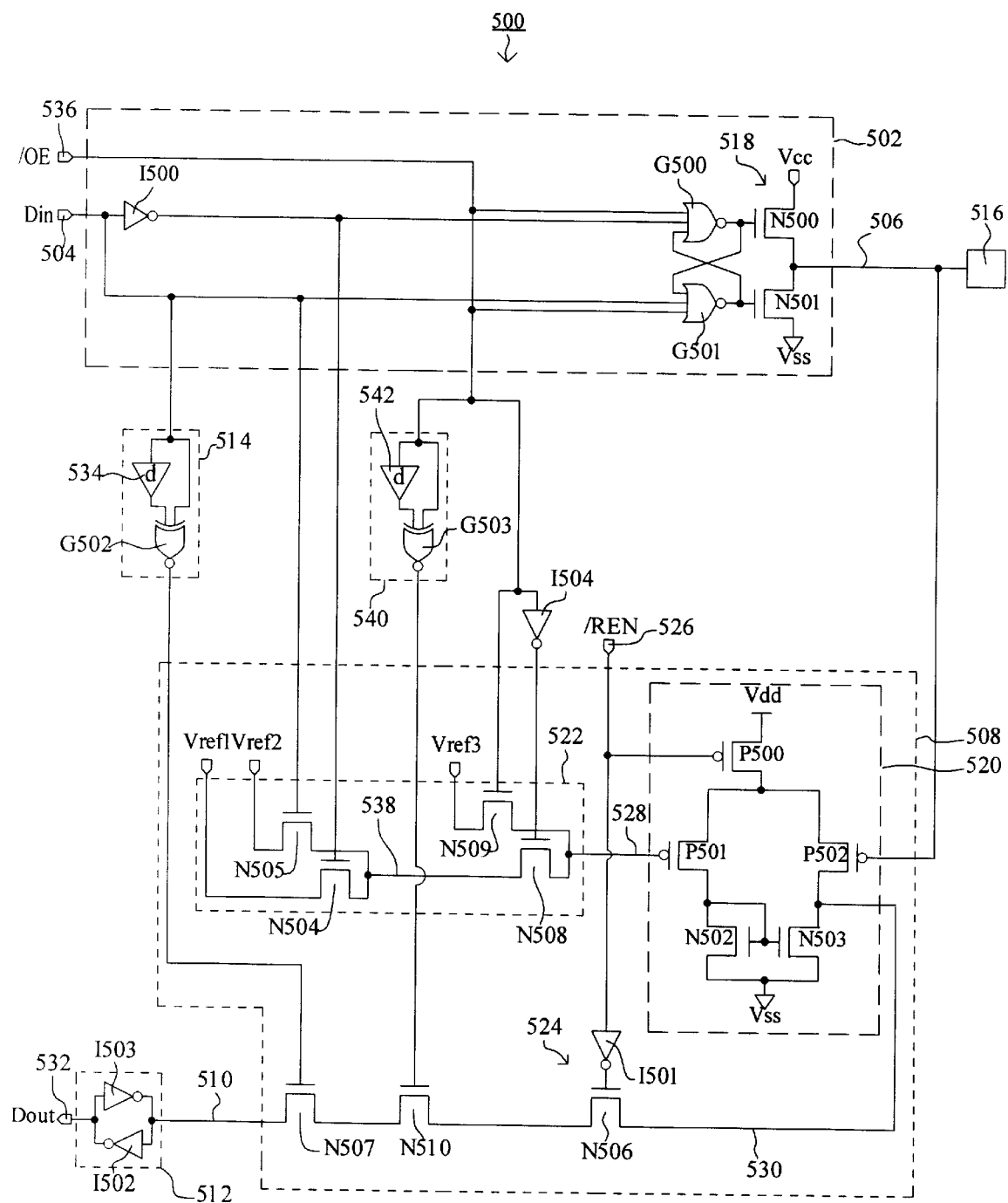
FIG. 5 is a schematic diagram illustrating a simultaneous bi-directional I/O circuit according to a second embodiment.

FIG. 5 sets forth a second embodiment of a bi-directional I/O circuit. The second embodiment is designated by the general reference character 500 and includes many of the same elements as the first embodiment set forth in FIG. 3A. To this end, like elements will be referred to by the same reference character, but with the first numeral of the character being changed from a "3" to a "5." For example, the first embodiment is designated by the reference character 300, and includes an output buffer 302 having an input inverter I300, a pull-up transistor N300 and a pull-down transistor N301. In FIG. 5, the second embodiment is designated by the general reference character 500, and includes an output buffer 502 having an input buffer I500, an input inverter I500, a pull-up transistor N500 and a pull-down transistor N501. Accordingly, an understanding of much of the operation of the second embodiment 500 can be understood with reference to FIGS. 3A and 3B, and the following description of the second embodiment 500 will be described in terms of how the second embodiment differs in operation from the first embodiment.

In addition to having the same general elements of the first embodiment 300, the second embodiment 500 includes three-input cross-coupled NOR gates G500 and G501. One input of each of the gates G500 and G501 is coupled to an output enable node 536. The output enable node 536 receives an output enable signal /OE. When /OE is high, the outputs of both gates G500 and G501 are low, regardless of the logic state of any of the other inputs to the gates. In this manner the /OE signal, when high, will disable the driver 518, turning off both the pull-up and pull-down transistors (N500 and N501), "tri-stating" the data bus line 506. When /OE is low, both gates G500 and G501, function in the manner of the first embodiment, ensuring excessive current is not pulled when the pull-up and pull-down transistors (N500 and N501) turn on and off in response to transitions in the Din signal.

The multiplexer 522 of the second embodiment 500 varies from that of the first embodiment 300, in that two levels of multiplexing are provided. The first level of multiplexing is accomplished by transistors N505 and N504, and is similar to that of the first embodiment. One of two reference voltages (Vref1 or Vref2) is selected according to the Din signal. Unlike the first embodiment, the selected reference voltage (Vref1 or Vref2) is not coupled directly to the reference node of a differential amplifier, but rather to a MUX node 538. The second level of multiplexing is accomplished by n-channel MOSFETs N508 and N509, and is determined by the /OE signal. In the event the /OE signal is low, the low logic signal will be inverted by /OE inverter I504, and applied to the gate of transistor N508. Transistor N508 will be turned on, and the MUX node 538 will be coupled to the reference node 528 of differential amplifier 520, and the input buffer 508 will detect voltage levels in the same fashion as the first embodiment. In the event the signal /OE goes high, transistor N508 will be turned off and transistor N509 will be turned on, coupling a third reference voltage Vref3, to the reference node. The third reference voltage is selected to be between the Vref1 and Vref2 reference voltages.

The operation of the second level of multiplexing, which quickly switches the voltage at the reference node 528 of the differential amplifier from either Vref1 or Vref2 to Vref3, may generate glitches at the amplifier output 530. To prevent such glitches from adversely affecting the logic level at the data output node 532, an n-channel /OE pass MOSFET N510 is provided between the read enable gate 524 and the pass transistor N507. The operation of /OE pass transistor N510 is controlled by /OE transition detector 540. The /OE transition detector 540 includes exclusive NOR gate G503, and /OE delay circuit 542, arranged in the same fashion as the transition detector 514. Thus, when the /OE signal makes a transition from one logic level to another, the /OE transition detector 540 generates a low-going pulse, the duration of which is determined by delay circuit 542. The low-going pulse from the /OE transition detector 540 will turn off /OE pass transistor N510, preventing any glitches generated from a transition in the /OE signal from propagating to the latch 512 and generating an erroneous Dout signal.

Figure 6:
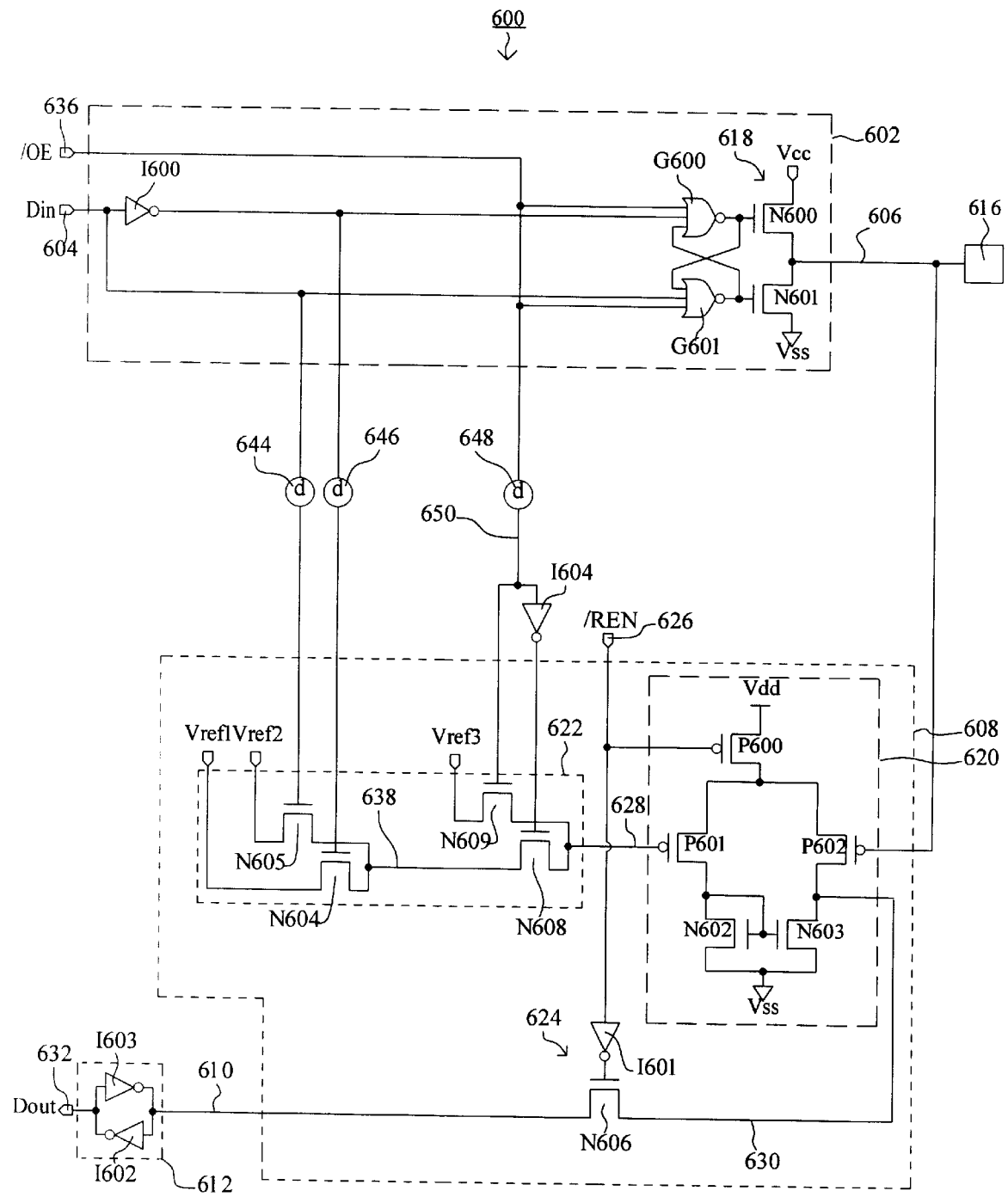
FIG. 6 is a schematic diagram illustrating a simultaneous bi-directional I/O circuit according to a third embodiment.

FIG. 6 sets forth a third embodiment of a bi-directional I/O circuit. The third embodiment is designated by the general reference character 600 and includes many of the same elements of the second embodiment set forth in FIG. 5. To this end, like elements will be referred to by the same reference character, but with the first numeral of the character being changed from a "5" to a "6." For example, the second embodiment is designated by the reference character 500, and includes an output buffer 502 having an input inverter I500, cross-coupled three-input NOR gate G500 and G501, and a driver 518. In FIG. 6, the third embodiment is designated by the general reference character 600, and includes an output buffer 602 having an input buffer I600, cross-coupled three-input NOR gate G600 and G601, and a driver 618. Accordingly, an understanding of much of the operation of the second embodiment 600 can be understood with reference to FIG. 5, and the third embodiment 600 will be described in terms of how it differs in operation from the second embodiment.

While the third embodiment 600 includes many of the same elements as the second embodiment 500, the third embodiment 600 does not include transition detectors for sensing changes in the Din signal or the /OE signal, or pass transistors to prevent glitches generated within the input buffer 608 from propagating to the data output node 632. Instead, the third embodiment 600 employs a series of delay circuits to prevent the formation of glitches in the input buffer 608.

Referring now to FIG. 6, the third embodiment 600 is shown to include three delay elements, a Din delay 644, a /Din delay 646 and a /OE delay 648. The Din delay 644 is coupled between the data input node 604 and the gate of transistor N605 within the MUX 622. In a similar manner, the /Din delay 646 is coupled between the output of inverter I600 and the gate of transistor N604. The /OE delay 648 is coupled between the /OE input node 636 and a MUX control node 650. The MUX control node 650 is coupled directly to the gate of transistor N609, and to the gate of transistor N608 by way of /OE inverter I604.

The delay elements (644, 646 and 648) introduce a delay in the application of the control signals (Din and /OE) to the MUX 622 so that transitions in the reference voltage of the differential amplifier will not occur until after corresponding transitions in the data bus line 606 are complete.

For example, assuming the /OE signal is low, and a second I/O circuit (not shown in FIG. 6) is driving the data bus line 606 high, when Din transitions from a low to high logic level, the output buffer 602 will begin to drive the data bus line 606 from an intermediate voltage level, to a high voltage level. The inherent capacitance of the data bus line 606 will result in a delay between the transition in the Din signal and the rise in voltage at the data bus line 606. The transition in the Din signal also switches the reference voltage at reference node 628 from Vref1 to Vref2 by operation of MUX 622. Unlike the prior art, due to the delay introduced by the Din delay 644 and /Din delay 646 (which slow the switching action of transistors N605 and N604) the voltage at the reference node 628 will not switch to Vref2 until the data bus line 606 is approximately Vref2, preventing the generation of a glitch. In other words, the delay produced by delays 644 and 646 correspond to the time required for driver 618 to drive the data bus line 606 from Vmid to Vref1 (in the case of a high-to-low Din transition), or to drive the data bus line 606 from Vmid to Vref2 (in the case of a low-to-high Din transition).

The third embodiment 600 eliminates glitches due to transitions in the /OE signal in a similar manner. Transitions in the /OE signal are delayed by /OE delay 648 so that the second level of multiplexing, performed by transistors N608 and N609, will not occur until the data bus node 606 is driven to a voltage level beyond that which would induce a glitch.

Figure 7:
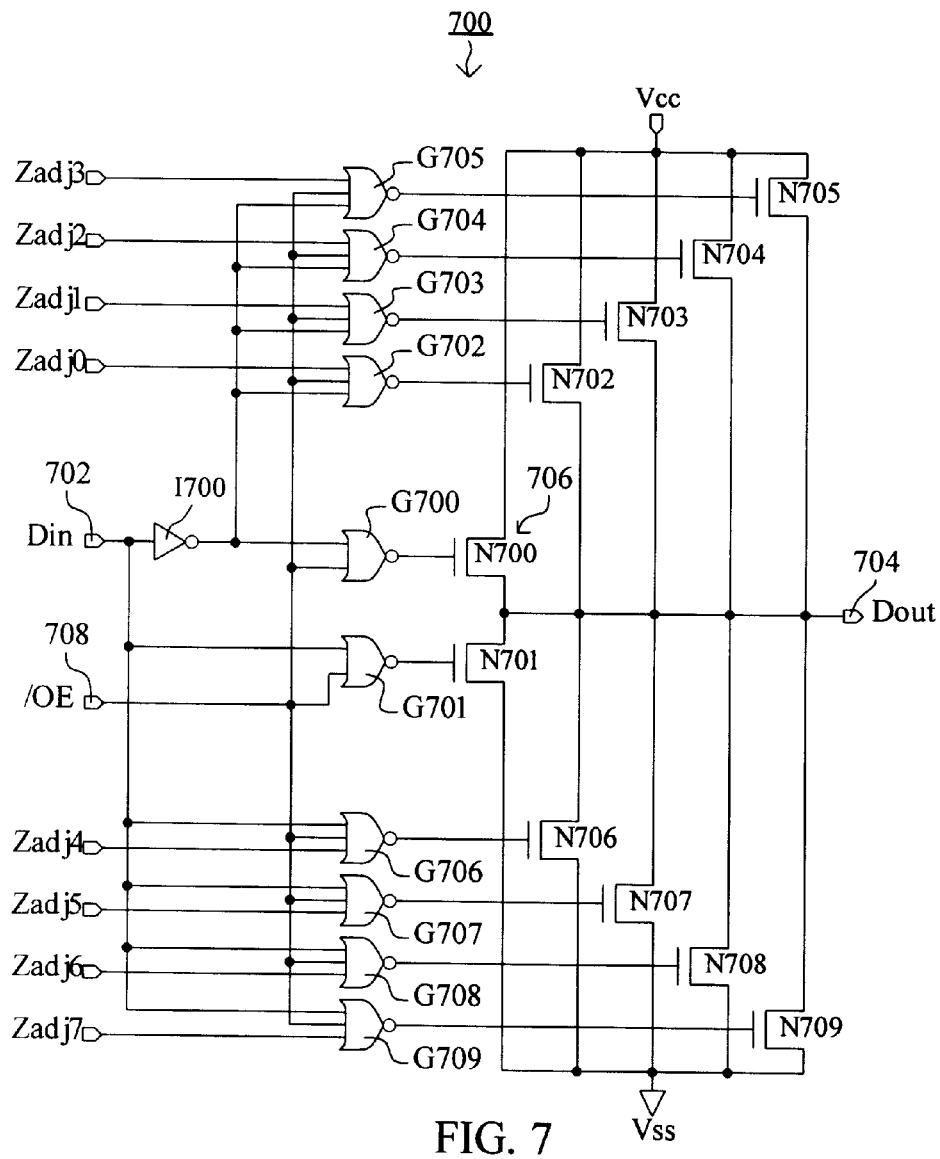
FIG. 7 is a schematic diagram illustrating an output buffer having an impedance matching circuit.

Referring now to FIG. 7, an output buffer 700 is set forth in a schematic diagram. The output buffer 700 may be used, for example, as the output buffer 406a or 406b, in FIG. 4, or the output buffer 502 in FIG. 5. The output buffer 700 of FIG. 7 has many of the same general elements as the output buffer 502 of FIG. 5, including a data input node 702, a data bus line 704, an input inverter I700, and a pair of cross-coupled NOR gates G700 and G701. The gate G700 and G701 control a driver 706 that includes a pull-up device N700 and a pull-down device N701. An output enable signal /OE is received at an enable node 708.

The output buffer 700 of FIG. 7 differs from the previously described output buffers in that it further includes impedance matching elements, n-channel MOSFETs N702–N708. Transistors N702–N705 are connected in parallel with the pull-up device N700, having source-drain paths coupled between the data bus line 704 and Vcc. In a similar fashion, transistors N706–N709 are connected in parallel with the pull-down device N701, having source-drain paths connected between the data bus line 704 and Vss. Each of the impedance matching elements N702–N705 and N706–N709, has a gate coupled to the output of a corresponding two-input NOR gate (G702–G705 and G706–G709). The gates G702–G705 receive as one input, the data input signal Din, with the second input to each of the gates G702–G705 receiving a different impedance adjustment signal (Zadj0–Zadj3). In a similar fashion, the gates G706–G709 receive as one input, the inverse of the Din signal (output of inverter I700), with the second input of gates G706–G709 receiving a different impedance adjustment signal (Zadj4–Zadj7).

In operation, when the Din signal is high, provided the /OE signal is low, the pull-up device N700 will be turned on. The high Din input signal will result in low outputs at gates G706–G709, turning off impedance matching devices N706–N709. At the same time, the high Din signal will turn off the pull-down device N701, but enable gates G702–G705. With gates G702–G705 enabled, selected of the signals Zadj0–Zadj3, can be driven low, turning on selected of the impedance matching devices (N702–N705). The selection of impedance matching devices N702–N705 will adjust the impedance seen by another device simultaneously transmitting data at the data bus line 704. Proper impedance matching will reduce reflection loss of the received signal, as well as ensure a proper signal midpoint level. Conversely, when Din is low, pull-down device N701 will be turned on, gates G702–G705 will be disabled, while gates G706–G709 will be enabled. The Zadj4–Zadj7 signals can then be used to turn on selected of the impedance matching devices (N706–N709) to provide proper impedance matching.

Figure 8:
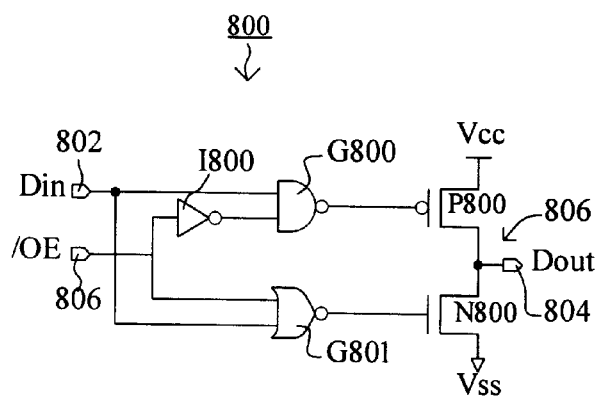
FIG. 8 is a schematic diagram illustrating an output buffer having a CMOS driver.

FIG. 8 sets forth another embodiment of an output buffer 800. The output buffer 800 includes a data input node 802 and a data bus line 804. The output buffer 800 differs from those previously described, in that it includes a CMOS driver 806, comprising p-channel MOSFET pull-up device P800, and n-channel pull-down device N800. The CMOS driver 806 is controlled by a two-input NAND gate G800 and a two-input NOR gate G801. One input to each gate (G800 and G802) is coupled to the data input node. The other input to the gates (G800 and G801) is an enable signal /OE. The signal /OE is applied directly to gate G800, and to gate G801 by way of enable inverter I800.

When the /OE signal is high, the output of NOR gate G801 is low, regardless of the logic state of the Din signal. The high /OE signal is inverted by enable inverter I800, and applied as a low input signal to NAND gate G800. This low input forces the output of gate G800 to a high level, regardless of the state of the Din signal. The high output of G800 and low output of G801 turn off both transistor P800 and transistor N800. In this manner a high /OE signal disables the driver 806. When the /OE signal is low, the low input to NOR gate G800 causes the gate G800 to function as an inverter. The low /OE signal is inverted by enable inverter I800, and a high input applied to gate G800, causing the gate G800 to function as an inverter as well. Thus, if Din high, a low signal is applied to transistor P800 and the pull-up device is turned on. A low input will also be applied to transistor N800, and the pull-down device will be turned off. Conversely, if Din is low, transistor P800 will be turned off, and transistor N800 will be turned on.

It is noted that while the described embodiments set forth particular embodiments, variations in the various circuit elements, such as the differential amplifier, latch, pass transistors, as just a few examples, would be obvious to one skilled in the art. As just a few example, the differential amplifier can include a differential pair comprising n-channel MOSFETs, with p-channel MOSFETs as the load devices. Impedance matching elements, such as those set forth in FIG. 7, may be included in the output buffers of the other embodiments, such as the output buffer 302 in FIG. 3, the output buffer 502 set forth in FIG. 5, and the output buffer 800 of FIG. 8.

Accordingly, although the present invention has been described in detail, it should be understood that various changes substitutions, and alterations can be made without departing from the spirit and scope of the invention as defined by the appended claims.

What is claimed is:

1. A data input/output (I/O) circuit for transmitting and receiving data, the I/O circuit comprising:
 a data bus line;
 a data input terminal;
 a driver circuit coupled to the data bus line and the data input terminal, the driver circuit receiving a data input signal from the data input terminal and transmitting an output signal on the data bus line;
 an input buffer coupled to the data bus line and an intermediate output terminal, the input buffer receiving the potential on the data bus line and transmitting a binary data signal on the intermediate output terminal;
 a transition detector coupled to the data input terminal, the transition detector generating a disable indication at a detector output when the data input signal at the data input node makes a transition from one logic state to another logic state; and
 a latch coupled to the intermediate output terminal, the latch being disabled by the disable indication.

2. The I/O circuit of claim 1, wherein:
 the input buffer includes a differential amplifier for comparing voltage potentials at a first amplifier input and a second amplifier input, the first amplifier input receiving the potential on the data bus line, the second amplifier input receiving a reference potential.

3. The I/O circuit of claim 2, wherein:
 the differential amplifier includes a current source that supplies a current when an enable node is at a first logic state, the current source being disabled when the enable node is at the second logic state.

4. The I/O circuit of claim 2, wherein:
 the differential amplifier includes an amplifier output, and an enable gate coupled between the amplifier output and the intermediate output node, the enable gate coupling the amplifier output to the intermediate output node when an enable node is at a first logic state, the enable gate isolating the amplifier output from the intermediate output node when the enable node is at a second logic state.

5. The I/O circuit of claim 2, wherein:
 the input buffer further includes a multiplexer having a multiplexer output coupled to the second amplifier input of the differential amplifier, and a plurality of multiplexer inputs coupled to a plurality of different reference voltages, the multiplexer coupling a first of the plurality of reference voltages to the multiplexer output when the data input signal is in first logic state, the multiplexer coupling a second of the plurality of reference voltages to the multiplexer output when the data input signal is in a second logic state.

6. The circuit of claim 5, wherein:
 the first of the reference voltages has a higher magnitude than the second of the reference potentials, the first logic level of the data input signal is a high logic level, the second logic level of the data input signal is a low logic level.

7. The circuit of claim 2, wherein:
 the differential amplifier is a CMOS differential amplifier.

8. The circuit of claim 1, wherein:
 the latch includes a pass transistor coupled between the intermediate output node and a store device, the gate of the pass transistor being coupled to the transition detector.

9. The circuit of claim 8, wherein:
 the store device includes a pair of cross coupled inverters.

10. The circuit of claim 1, wherein:
 the driver circuit includes
 a pull-up device and a pull-down device coupled to the data bus line, and
 a logic circuit coupled to the pull-up and pull-down devices, the logic circuit
 activating the pull-up device and de-activating the pull-down device in response to a first logic level at the data input terminal,
 de-activating the pull-up device and activating the pull-down device in response to a second logic level at the data input terminal, and
 de-activating the pull-up device before activating the pull-down device in response to a transition from the first logic level to the second logic level at the data input terminal.

11. The circuit of claim 10, wherein:
 the logic circuit includes a pair of cross-coupled NOR gates.

12. The circuit of claim 1, wherein:

the driver circuit includes
- a pull-up device and a pull-down device coupled to the data bus line, and
- a logic circuit coupled to the pull-up and pull-down devices, the logic circuit
  activating the pull-up device and de-activating the pull-down device in response to a first logic level at the data input terminal,
  de-activating the pull-up device and activating the pull-down device in response to a second logic level at the data input terminal, and
  de-activating the pull-down device before activating the pull-up device in response to a transition from the second logic level to the first logic level at the data input terminal.

13. The circuit of claim 1, wherein:

the transition detector includes a logic gate having a first input and a second input, and a delay circuit, the first input of the logic gate being coupled to the data input terminal, the delay circuit being intermediate the second logic gate input and the data input terminal.

14. The circuit of claim 1, wherein:

the data bus line potential received by the input buffer varies in response to a second output signal received simultaneously with the data input signal on the data bus line, and the input buffer transmits data on the intermediate output terminal, the transmitted output data being determined by the logic level of the second output signal simultaneously received by the data bus line.

15. A data input/output (I/O) circuit for simultaneously transmitting and receiving data, the I/O circuit comprising:

a data bus line;

a data input terminal;

an enable terminal;

a driver circuit coupled to the data bus line and the data input terminal, the driver circuit receiving a data input signal from the data input terminal and transmitting an output logic value on the data bus line; and an input buffer coupled to the data bus line and an intermediate output terminal, the input buffer having
- an enable mode, in which the input buffer can receive an input logic value from the data bus line simultaneously with the transmission of the output logic value on the data bus line, and transmit a binary data signal on the intermediate output terminal, wherein the input logic value can be different from the output logic value, and
- a disable mode, in which the intermediate output terminal is maintained at a predetermined potential despite voltage transitions on the data bus line, the input buffer being in the enable mode when an enable signal at a first logic level is applied to the enable terminal, the input buffer being in the disable mode when an enable signal at a second logic level is applied to the enable terminal.

16. The circuit of claim 15, wherein:

the input buffer includes a differential amplifier having a current source that supplies a current to the differential amplifier when the enable signal applied to the enable terminal is at the first logic level, the current source being disabled when the enable signal applied to the enable terminal is at the second logic level.

17. The circuit of claim 16, wherein:

the current source is an insulated gate field effect transistor (IGFET) having a source coupled to a power supply voltage, and a gate coupled to the enable terminal.

18. The I/O circuit of claim 15, wherein:

the input buffer includes a differential amplifier having an amplifier output, and an enable gate coupled between the amplifier output and the intermediate output node, the enable gate coupling the amplifier output to the intermediate output node when the enable signal applied to the enable terminal is at the first logic level, the enable gate isolating the amplifier output from the intermediate output node when the enable signal applied to the enable terminal is at the second logic level.

19. The I/O circuit of claim 18, wherein:

the enable gate includes an IGFET having a source-drain path coupled between the intermediate output node and the amplifier output.

20. The I/O circuit of claim 15, wherein:

the input buffer includes a differential amplifier for comparing voltage potentials at a first amplifier input and a second amplifier input, the first amplifier input receiving the potential on the data bus line, the second amplifier input receiving a reference potential.

21. The I/O circuit of claim 20, wherein:

the input buffer further includes a multiplexer having a multiplexer output coupled to the second amplifier input of the differential amplifier and a plurality of multiplexer inputs coupled to a plurality of different reference voltages, the multiplexer coupling a first of the plurality of reference voltages to the multiplexer output when the data input signal is in first logic state, the multiplexer coupling a second of the plurality of reference voltages to the multiplexer output when the data input signal is in a second logic state.

22. The I/O circuit of claim 15, further including:

a latch coupled to the intermediate output terminal, the latch maintaining a logic state when the input buffer is in the disable mode.

23. A data input/output (I/O) circuit for simultaneously transmitting and receiving data, the I/O circuit comprising:

a data bus line;

a data input terminal;

an output enable terminal;

an input buffer coupled to the data bus line and an intermediate output terminal, the input buffer receiving an input signal on the data bus line and transmitting a data signal on the intermediate output terminal; and a driver circuit coupled to the data bus line, the data input terminal, and the output enable terminal, the driver circuit having
- an enable mode, in which the driver circuit receives a data input signal from the data input terminal and can transmit an output signal on the data bus line at the same time the input signal is received on the data bus line, wherein the logic value of the output signal can be different from the simultaneously received input signal, and
- a disable mode, in which the data input signal is isolated from the data bus line, the driver circuit being in the enable mode when the output enable terminal is at a first logic level, the driver circuit being in the disable mode when the output enable terminal is at a second logic level.

24. The I/O circuit of claim 23, wherein:

the input buffer includes a differential amplifier for comparing voltage potentials at a first amplifier input and a second amplifier input, the first amplifier input receiving the input signal on the data bus line, the second amplifier input receiving a reference potential.

25. The I/O circuit of claim 24, wherein:

the input buffer further includes a multiplexer having a multiplexer output coupled to the second amplifier input of the differential amplifier, and a plurality of multiplexer inputs coupled to a plurality of different reference voltages, the multiplexer coupling a first of the plurality of reference voltages to the multiplexer output when the output enable terminal is at the first logic level, the driver circuit being in the disable mode when the output enable terminal is at the second logic level.

26. The I/O circuit of claim 23, further including:

a transition detector coupled to the output enable terminal, the transition detector generating a pulse at a detector output when the voltage at the output enable terminal transitions from one logic state to another logic state; and an enable gate coupled between the intermediate output node and a data output node, the enable gate being disabled in response to the pulse at the detector output.

27. A data input/output (I/O) circuit for transmitting and receiving data, the I/O circuit comprising:

a data bus line;

a data input terminal;

a driver circuit coupled to the data bus line and the data input terminal, the driver circuit receiving a data input signal from the data input terminal and transmitting an output signal on the data bus line; and an input buffer coupled to the data bus line and an intermediate output terminal, the input buffer including an amplifier for comparing the voltage level of the data output terminal with the voltage level of a reference terminal, and driving the intermediate output node in response thereto, a first multiplexer circuit for coupling a first reference voltage node to the reference terminal in response to a first logic level at a first multiplexer input and coupling a second reference voltage node to the reference terminal in response to a second logic level at the first multiplexer input, and a data input delay circuit coupled between the data input terminal and the first multiplexer input that delays switching between both the first reference voltage and the second reference voltage with respect to changes in potential at the data input terminal.

28. The I/O circuit of claim 27, further including:

an enable node; and the input buffer further includes a second multiplexer circuit for coupling a second reference voltage node to the reference terminal in response to a first logic level at a second multiplexer input, and an enable delay coupled between the enable node and the second multiplexer input.

29. A data transmission system, comprising:

a first driver circuit coupled to a data bus, the first driver circuit having an enable mode for coupling the data bus to a high bus voltage in response to a first input signal at a first logic level, and coupling the data bus to a low bus voltage in response to a first input signal at a second logic level, the first driver circuit further having a disable mode for isolating the first input signal from the data bus;

a second driver circuit coupled to the data bus that can couple the data bus to the high bus voltage in response to a second input signal at a first logic level, and can couple the data bus to the low bus voltage in response to a second input signal at a second logic level at the same time the first driver circuit couples the data bus to the low or high bus voltage; and a first input circuit coupled to the data bus for comparing the voltage of the data bus with a predetermined reference voltage, and driving a first intermediate output node to a first logic level when the data bus voltage is less than the predetermined reference voltage due to the operation of the second driver circuit, and driving the first intermediate output node to a second logic level when the data bus voltage is greater than the predetermined reference voltage due to the operation of the second driver circuit at the same time the first driver circuit couples the data bus to the low or high bus voltage.

30. The data transmission system of claim 29, further including:

a second input circuit coupled to the data bus for comparing the voltage of the data bus with a predetermined reference voltage and driving a second intermediate output node to a first logic level when the data bus voltage is less than the predetermined reference voltage due to the operation of the first driver circuit, and driving the second intermediate output node to a second logic level when the data bus voltage is greater than the predetermined reference voltage due to the operation of the first driver circuit.

31. The data transmission system of claim 29, further including:

a first gate circuit coupling the voltage at the first intermediate output node to a first data output node when the first input signal is at a predetermined logic level, and isolating the first intermediate output node from the first data output node when the first input signal makes a transition between logic levels.

32. The data transmission system of claim 31, further including:

a second gate circuit coupling the voltage at the second intermediate output node to a second data output node when the second input signal is at a predetermined logic level, and isolating the second intermediate output node from the second data output node when the first input signal makes a transition between logic levels.

33. A simultaneous bi-directional input/output (I/O) circuit, comprising:

an output buffer circuit for generating a to-be-transmitted output signal on a data bus line in response to a data input signal;

an input buffer circuit for driving a data output node between at least two logic levels in response to a to-be-received data signal on the data bus line and the to-be-transmitted data signal on the data bus line, the input buffer circuit including a multiplexer having a control input that receives the data input signal, the multiplexer coupling one of a plurality of reference voltages to an input buffer compare node; and means for preventing the generation of erroneous logic signals at the data output node during transitions in the data input signal.

34. The simultaneous bi-directional I/O circuit of claim 33, wherein:

the input buffer includes
a compare circuit for comparing the potential of the data bus with the potential at the reference node.

35. The simultaneous bi-directional I/O circuit of claim 34, wherein:

the output buffer includes a data input node for receiving the data input signal; and the means for preventing includes a delay circuit coupled between the data input node and the multiplexer.

36. The simultaneous bi-directional I/O circuit of claim 33, wherein:

the input buffer includes an intermediate output node and the data output node; and the means for preventing includes
a data input transition detector for generating a disable indication in response to a transition in the data input signal, and
a disable gate coupled between the intermediate output node and the data output node, the disable gate isolating the intermediate output node from the data output node in response to the disable indication.

37. The simultaneous bi-directional I/O circuit of claim 33, wherein:

the output buffer includes a pull-up device and a pull-down device, the pull-up and pull-down device being disabled by a disable signal.

38. The simultaneous bi-directional I/O circuit of claim 37, wherein:

the input buffer includes an intermediate output node and the data output node; and the means for preventing further includes
an enable transition detector for generating a disable indication in response to a transition in the disable signal, and
a disable gate coupled between the intermediate output node and the data output node, the disable gate isolating the intermediate output node from the data output node in response to the disable indication.

* * * * *